United States Patent [19]
Sprangle et al.

[11] Patent Number: 5,892,810
[45] Date of Patent: Apr. 6, 1999

[54] X-RAY SOURCE FOR LITHOGRAPHY

[75] Inventors: Phillip Sprangle, Potomac; Bahman Hafizi, Bethesda, both of Md.; Frederick Mako, Fairfax Station, Va.

[73] Assignee: The United States of America as represented by the Secretary of the Navy, Washington, D.C.

[21] Appl. No.: 520,229

[22] Filed: May 9, 1990

[51] Int. Cl.$^6$ ...................................................... H01J 35/00
[52] U.S. Cl. ........................................... 378/119; 378/210
[58] Field of Search ............................................... 379/119

[56] References Cited

U.S. PATENT DOCUMENTS

| | | |
|---|---|---|
| 3,947,687 | 3/1976 | Fenstermacher . |
| 3,961,197 | 6/1976 | Dawson . |
| 4,184,078 | 1/1980 | Nagel et al. . |
| 4,618,971 | 10/1986 | Weiss et al. . |
| 4,803,713 | 2/1989 | Fujii . |
| 4,817,124 | 3/1989 | Ketterson et al. ....................... 378/119 |

OTHER PUBLICATIONS

K. Halbach et al, "A Permanent Magnet Undulator for Spear," IEEE Transactions On Nuclear Science, NS–58, 3136 (1981).

X–Ray Lithography Research: A Collection of NRL Contributions, NRL Memorandum Report 5731 (1987.

D.J. Nagel, "Submicrosecond X–Ray Lithography," Elec. Lett. 14,781 (1978).

P. Sprangle et al., "New X–Ray Source for Lithography," App. Phys. Lett 55,24 (Dec. 11, 1989).

A. Bienenstock and H. Winick, "Synchrotorn Radiation Research," Physics Today 36, 48 (1983).

K. Halbach, "Design of Permanent Multipole Magnets with Oriented Rare Earth Cobalt Material," Nucl. Inst. & Meth. 1691 (1980).

Sprangle et al, "An X–Ray Source for Lithography Based on a Quasi–Optical Maser Undulator", Naval Research Laboratory Memorandum Report 6274, May 9, 1989, 44 pages.

"Synchrotron Radiation", Winick Scientific American V 257N5, Nov. 1987 pp. 88–99.

*Primary Examiner*—Craig E. Church
*Attorney, Agent, or Firm*—Thomas McDonnell; Edward F. Miles

[57] ABSTRACT

An x-ray lithography device in which a beam of electrons interacts with a microwave field of a quasi-optical maser such as a quasi-optical gyrotron. This maser comprises a pair of spaced mirrors defining a quasi-optical cavity therebetween, with one mirror being provided with an orifice to permit extraction of the x-ray beam produced. A Bragg reflector is connected to the mirror orifice to reduce the microwave power loss from the device through the orifice. Electrons injected in the maser cavity are caused to "wiggle" by the interacting microwave field, which functions as an undulator, so as to produce a non-coherent x-ray beam that travels along the longitudinal axis of the cavity and exits through the mirror orifice.

8 Claims, No Drawings

X-RAY SOURCE FOR LITHOGRAPHY

FIELD OF THE INVENTION

The present invention relates to an x-ray source for use in a lithographic process for the production of integrated circuits.

BACKGROUND OF THE INVENTION

A major contributor to the very substantial developments taking place in information processing is the miniaturization of semiconductor devices marketed by the electronics industry. In fact, the ability to achieve and maintain a leadership position in the fast developing technology for fabricating smaller and cheaper integrated circuits (IC) can play a key role in the economic well-being of any country. One process by which such IC's are mass produced is lithography. Using this technique, a predetermined pattern can be rapidly replicated on the surface of a semiconductor chip using a beam of radiated particles. A reliable, efficient and compact source of radiation or particles is critical to the economic viability of lithography. This is especially so because of the high capital expenditure required for the sources necessitated by further miniaturization.

A good discussion of lithography is contained in "x-ray Lithography Research; A collection of NRL Contributions", R. R. Whitlock, Editor, Naval Research Laboratory Memorandum report 5731 (1987). As discussed in this report, the crystal-growing industry routinely provides silicon crystals about 5" or more in diameter and once a single-crystal ingot is grown, it is sliced into wafers which are then used for device fabrication. Planar technology consists, for example, in selective introduction of dopant atoms into small precisely predetermined areas of the silicon surface to form regions of p- and n- type material. Dopant atoms can be introduced simultaneously into many separate, small regions of the wafer. Therefore, the use of larger diameter wafers and smaller device dimensions minimizes the process cost per device. The technique for replication of a predetermined pattern on a silicon wafer is referred to as lithography. The pattern may correspond, for example, to an opening for introduction of dopant atoms by diffusion or implantation. Lithography involves the application of a thin film of a radiation-sensitive plastic, called a photoresist, onto the surface of the wafer. The photoresist is then exposed to radiation through a mask bearing the desired feature so as to create a shadow image on the resist.

Current state-of-the-art miniaturization requirements by the IC industry demand the ability to resolve submicron minimum features of patterns to be replicated. However, for mass production of critical, leading-edge circuits for computers, memories, signal processors and other devices, resolutions approaching $\leq 0.1$ $\mu$m will be required. Resolution, therefore, is a determining factor in the quest for greater density. However, as is well known, diffraction provides a fundamental barrier to resolution. If d is the line width of the feature in the mask to be replicated and $\lambda$ is the wavelength of the radiation, the diffraction angle is $\lambda/d$, so that if s is the mask-to-resist separation, the blur on the resist is $\lambda/(d)s$. Thus, to reduce blur, it is necessary to use short wavelength radiation, x-rays, or energetic particle beams.

As far as the resolution is concerned, x-ray radiation or particle beams are satisfactory sources. Of course, other factors such as throughput and yield must be considered in selecting the most appropriate source for lithographic purposes. A direct-write technique with tightly focussed electron or ion beams is frequently used for extremely high-resolution process. The wavelength $\lambda$ of an electron of momentum p is $\lambda=h/p$ where h is Planck's constant. Thus, for a 20 keV electron beam, $\lambda=2.5\times10^2$ Å. With such short wavelengths, "computer-controlled particle beams are ideal for making high-quality patterns on masks which are then used for" resist exposure in quantity. However, the main problem with the electron-beam direct-write process for mass production is that it is slow compared to parallel exposure through a mask. In addition, particle beams spread out upon impinging on a resist, and there is also some backscattering and thus possible damage to the mask.

Because x-ray sources have a high throughput compared to direct-write techniques, the use of such x-ray sources as lithography has considerable potential. Three common sources of x-ray radiation that appear to be good candidates for lithography are electron-impact (x-ray tube), high-temperature plasma, and synchrotron radiation. To compare these, the following important characteristics must be considered in making a choice between different sources: emission intensity; efficiency of x-ray generation and usage; spectral character of radiation (lines, continuum, etc.); energy range of emitted photons; source size (important for resolution); emission solid angle (determines collimation and exposure area); pulsed or continuous wave (CW). Further, in comparing the different x-ray sources, the use of material the polymethyl methacrylate (PMMA) will be considered. PMMA is a popular, high-resolution resist suitable for submicron work. To fully expose PMMA one requires 1 J/cm$^2$ of 12 Å radiation. More generally, the range of useful photon energies is 0.5–1.5 keV (20–8 Å). Photon energy influences resist absorption which, along with the intensity, determines the exposure time. In common with ordinary photography, faster resists than PMMA are found to exhibit poorer resolution.

Turning to the properties of the three common sources of x-ray radiation mentioned above, x-ray tubes were the first source to be used for x-ray lithography. The radiation is uncollimated and is in the form of lines (bound-to-bound transitions) and a continuum (free-to-free transitions in the nuclear coulombic field). x-ray tubes are inefficient, with typically much less than 1% of the electron beam energy being converted into (total) x-ray radiation.

x-ray radiation from plasmas at $10^6$–$10^{7\circ}$ K. is in the form of a line spectrum (bound-to-bound transitions), continue with high-energy cut-off (free-to-bound transitions), and continuum (free-to-free bremsstrahlung). Heating of the plasma is achieved using a discharge, as in a z-pinch, or a high powered laser as described in Nagel et al., Electron. Lett. 14,781 (1978), and the radiation is spread over a large solid angle ($2\pi$ to $4\pi$). The process is necessarily pulsed with a lifetime of 10–100 ns for discharge heating and 1–10 ns for laser heating. Efficiencies are in the range from 1–10%. Some of the problems associated with high-temperature plasma lithography include the following: contamination of mask and/or resist by debris from the plasma; low repetition rate; thermal response of mask and/or resist to very intense, pulsed heating; and significant shot-to-shot variability of plasma sources.

Patents relating to the use of plasma sources include U.S. Pat. Nos. 3,961,197 (Dawson); 4,184,078 (Nagel et al.); and 4,618,971 (Weiss et al.). The Dawson patent discloses a method for producing coherent secondary x-rays from a plasma device using a laser activated plasma source. A disadvantage of this method is that pulsed x-rays are generated and these x-rays are coherent (it being noted that coherent x-rays are have no advantage over non-coherent x-rays in lithography, the ultimate purpose being to burn a semiconductor, rather than maintain a coherent wavefront.) The Nagel et al. patent discloses a plasma source that produces x-rays via laser excitation; the x-rays produced are coherent x-rays. The Weiss et al. patent discloses an arrangement wherein the plasma is contained in a magnetic field established by an electrical current. This has the advantage providing greater control over shot-to-shot variability but does not solve the other problems mentioned above.

Synchrotron radiation is generated by electrons in synchrotron accelerators and storage rings. It is basically magnetic bremsstrahlung due to the curved motions of the particles in the bending (dipole) magnets. Although the radiation process is efficient, use of the emitted radiation is quite inefficient due to the large fraction that is lost onto the vacuum chamber walls (often about 90%). Because the radiation is highly collimated, $\leq 1$ mrad for a 1 Gev electron beam, the mask-wafer separation and wafer flatness are less critical than with x-rays from a point-source with highly-diverging rays such as plasma sources. The spectrum is continuous so that filters and/or mirrors must be used to select the desired wavelength band for lithography work.

In existing and proposed storage rings, electrons are typically injected at low energy, ⁻150 MeV, and then accelerated to about 1 GeV while the bending magnets are ramped up to about 4–5 T. These arrangements are designed for compactness, with linear dimensions on the order of several meters. Superconducting magnet designs are also available and somewhat more compact, although such designs involve added cost and require additional space for the cryogenic system. Thus far, the most important source of x-ray synchrotron radiation is that provided by a dedicated storage rings to be found in many national laboratories throughout the world. However, it will be appreciated that these machines are extremely expensive and occupy a great deal of space. On the other hand, the commercial storage rings for x-ray lithography are only now becoming available.

Patents relevant to the use of synchrotron radiation include U.S. Pat. Nos. 3,947,687 (Fenstermacher) and 4,803,713 (Fujii). The Fenstermacher patent discloses the use of a collimated x-ray beam to improve efficiency. This is accomplished by a collimator that absorbs undesired x-rays instead of reflecting them via a mirror arrangement as in the prior art. The Fujii patent discloses the use of mirrors to deflect the x-rays to the desired position on the mask.

As described below, the present invention involves the use of an electromagnetic undulator in generating x-rays for lithographic applications. The use of periodic undulators and wigglers to achieve higher brightness (energy radiated per unit bandwidth per unit solid angle), and to modify the spectral character of the storage rings is by now well-established. (See, e.g., Winnick et al., Phys. Today.36,49 (1983).) Due to the complexity and construction costs of electromagnets (conventional or superconducting), recent developments in the fabrication of high-field, rare-earth cobalt permanent magnets have led to their almost universal use as insertion devices in storage rings. Reference is made, e.g., to Halbach, Nucl. Instr. and Meth. 169,1 (1980) and Halbach et al., IEEE Trans. Nucl. Sci. NS –28, 3136 (1981).

Defining the dimensionless magnetic field parameter $K=(|e|B_o\lambda_o)/(2\pi mc^2)$, where e is the charge and m is the rest-mass of an electron, c is the speed of light in vacuum, $B_o$ is the peak magnetic induction and $\lambda_o$ is the period of the planar undulator or wiggler, the wavelength $\lambda$ of the radiation emitted along the beam direction is given by $\lambda=[\lambda_o(1+K^2/2)]/[2\gamma^2]$, where $\gamma$ is the relativistic mass factor.

Typically, $\lambda_o$ ranges over 1–10 cm so that for x-ray radiation in the required range of 8–20 Å, electron energies upwards of several GeV are required. On the other hand, lower energy electrons, e.g., at 150 MeV, might be used together with extremely short- period insertion devices. However, to maintain the same magnetic field strength there has to be a corresponding decrease in the gap spacing between opposite poles of the magnet and this implies very thin filamentary electron beams and correspondingly high electron-beam brightness.

Finally, U.S. Pat. No. 4,817,124 (Ketterson et al.) discloses the use of a high frequency laser to produce x-rays via the excitation of a piezoelectric material by microwave radiation. Coherent radiation is generated, and the use of a lasing system to generate x-rays also creates an intrinsic problem with respect to the electron beam quality associated with the lasing action.

From the foregoing, one can see that the electronics industry has an ongoing need for x-ray sources that are compact, energy efficient, and inexpensive. Current x-ray sources suitable for x-ray lithography are generally large, energy inefficient, and very expensive, the synchrotron being an excellent example. One key to the success of x-ray lithography will be the extent to which the technology becomes available to the scientific community generally, rather than to just a few large organizations with unusually large resources.

Much work has been done to develop free electron lasers for the many scientific applications requiring a source of coherent x-rays. Generally, the output wavelength $\lambda_x$ of such a laser relates to the microwave input wavelength $\lambda_\mu$ by:

$$\lambda_x=(\lambda_\mu/4\gamma^2)$$

Where, again, $\gamma^2=1/(1-v^2/c^2)$, v=electron velocity, and c=the speed of light.

From this relation, one would naturally try to increase the x-ray output frequency by increasing electron energy. The generation of coherent electron beams at such high energies, however, makes such lasers prohibitively expensive for general users, and, heretofore, not a potential tool for lithography.

On the other hand, there are relatively compact, efficient, and inexpensive sources of high energy, incoherent, electron beams, for example high the power undulator mentioned above.

SUMMARY OF THE INVENTION

Applicants have realized that incoherent x-radiation would be as effective in x-ray lithography as coherent x-radiation, the ultimate purpose being to burn a photoresist rather than maintain a coherent wavefront. From this, they have further realized that existing gyrotron systems, using existing high energy electron storage rings can be adapted to produce incoherent x-rays of the frequencies needed for lithography.

Broadly speaking, the present invention involves the use of a high-power electromagnetic wave to generate x-ray radiation in the required wavelength range in contrast to, and as an improvement over, the permanent magnet devices of the prior art discussed above, and, more particularly, the use of a high-power electromagnetic wave of moderate wavelength ($\leq 1$.mm) which interacts with moderate energy electrons ($\leq \frac{1}{4}$ GeV) to produce the x-ray radiation. The device of the invention is compact and relatively inexpensive as compared with permanent magnet x-ray sources and is still capable of an output production rate (throughput) in the lithographic fabrication of integrated circuits on semiconducting wafers which is comparable to such prior art sources.

In accordance with the invention, an x-ray source is provided for use in lithography in the production of integrated circuits, wherein the x-ray source comprises: beam producing means for producing a beam of electrons; and an electromagnetic undulator means for producing an electromagnetic field which interacts with said beam of electrons to produce a beam of x-ray radiation.

In accordance with a preferred embodiment, the electromagnetic undulator means comprises a quasi-optical gyrotron including a quasi-optical resonator comprising first and second spaced mirrors defining a quasi-optical cavity therebetween. The beam producing means preferably includes means for injecting the electrons of the electron beam into the cavity along a path which includes the longitudinal axis of the cavity for interaction with the electromagnetic field, and one of the mirrors includes an orifice therein, in alignment with the longitudinal axis of the cavity, through which the beam x-ray beam exits from the cavity.

According to an important feature of the invention, a means is provided for preventing loss of electromagnetic power from the quasi-optical cavity through the orifice in the one mirror. In a preferred embodiment, the loss preventing means comprises a reflector means connected to the mirror orifice for effectively plugging the cavity against electromagnetic power loss. The reflector means preferably comprises a Bragg reflector including a plurality of periodically spaced corrugations along the length thereof, the periodic spacing of the corrugations being such that the microwave field is effectively trapped and reflected and such that the x-ray beam is allowed to pass unhampered through the Bragg reflector. In an alternate embodiment, the loss preventing means comprises a tube which is connected to the mirror orifice and across which a jet of neutral gas is pumped.

As discussed below, although other devices can be used, the electron producing means preferably comprises a storage ring.

Further, although, again, other devices can also be used, in accordance with an alternate embodiment of the invention to that discussed above, the electromagnetic undulator can comprise a high power laser and, advantageously, a high power pulsed $CO_2$ laser.

Other features and advantages of the invention will be set forth in, or apparent from, the following detailed description of preferred embodiments of the invention.

DESCRIPTION OF THE PREFERRED EMBODIMENT

The following describes an x-ray source constructed in accordance with a preferred embodiment of the invention. The basic components of the x-ray source of the embodiment are a quasi-optical gyrotron with a pair of spaced mirrors which define an open quasi-optical resonator cavity therebetween, and an electron storage ring, which produces a ring of electrons. The gyrotron functions as a short-wavelength electromagnetic undulator and is preferably of the type described in Fliflet et al., "Design and Operating Characteristics of a CW Relevant Quasi-Optical Gyrotron with Variable Mirror Separation", NRL Memorandum Report 6459 (Jun. 26, 1989).

The storage ring is of conventional construction wherein a closed vacuum chamber threads through the components of the storage ring which components include the bending magnets and the rf cavity. The injection of electrons of electron ring (beam) can be at an energy below the energy of the operation of x-ray source in which case the storage ring is used to accelerate the electrons to their final energy within several minutes. The lifetime of the beam may be several hours depending on the average pressure in the storage ring. It is noted that with the use of a short-wavelength undulator such as a gyrotron, there is a requirement for a moderately energetic election beam at high average current levels. Thus, for the electron beam energies of interest ($\leq\frac{1}{2}$ GeV), other electron beam sources such as microtrons may also be appropriate. However, microtrons are typically limited to very low currents ($\leq 1$ mA), while linacs that could also be suitable are fairly expensive and thus storage rings presently appear to be the most suitable electron beam source.

In the quasi-optical gyrotron, an electromagnetic-undulator field is generated within the cavity bounded by the mirrors. A gyrating electron beam which propagates perpendicular (transverse) to the longitudinal axis of the resonator cavity is produced which interacts with an external magnetic field to produce the electromagnetic-undulator (microwave) field. Reference is made to the Fliflet et al. article referred to above for a more complete description of the construction and operation of a suitable gyrotron.

The mirrors provide a focal point within the cavity at which the microwave energy in the electromagnetic field is concentrated. The focal point is located on the elliptical path traveled by the electrons produced by the storage ring, at the beginning of a straight portion of that path which is coincident with the longitudinal axis of the resonator cavity. The interaction at this focal point between the microwave energy and the electrons of the path produces an x-ray beam. This interaction continues along this portion or section of the path, with L denoting the interaction length, and the beam is projected along the longitudinal axis of resonator cavity. Stated differently, the electrons traveling along the path are caused to undulate or "wiggle" by the microwave field which interacts with the electrons along the path length L so as to generate the x-ray beam. The x-ray beam is confined to a cone of half-angle $1/\gamma$, wherein $\gamma$ is the electron beam relativistic factor. The wavelength $\lambda$ of x-ray is given by formula $\lambda=\lambda_o(1+K^2/2)/4(\gamma)^2$, where $\gamma$, as noted above, is the relativistic mass factor. This expression is approximately equal to $\lambda_o/4\gamma^2$. $\lambda_o$ is the period of the planar electromagneitc undulator.

One of the mirror includes an orifice therein through which the beam passes. The orifice is in alignment with the longitudinal axis of the cavity and is centered, at least in the horizontal plane, in the middle of the mirror.

As discussed above, the diameter of the x-ray beam is $2/\gamma$. Thus as the energy of electrons increases, the tightness of the beam also increases. This results in a narrowly confined x-ray output at the orifice, with correspondingly low losses to the walls of the gyrotron, making the system particularly energy efficient.

A Bragg reflector is connected to the orifice so as to effectively plug the cavity against the loss of microwave power through the orifice. The Bragg reflector, which essentially comprises a long metallic tube including corrugations spaced periodically therealong, reduces the loss of microwave by providing spacing of the corrugations with a period that effectively traps and reflects the microwave radiation, while permitting the x-ray beam to exit unhampered from the cavity through the tube.

In an alternate embodiment, a gas breakdown scheme can be provided to stop microwave leakage from the orifice of the mirror. More particularly, a tube can be connected to the orifice and a jet of neutral gas pumped across the tube. At a gas pressure of 20 torr, x-ray absorption is negligible, but the plasma density of the gas exceeds the microwave frequency and this plasma may completely eliminate the loss of the microwaves from the cavity. In other words, if the gas density is sufficiently high, the microwaves will be reflected back into, and therefore retained within, the cavity so long as the microwave field exceeds the breakdown field for ionization of the neutral gas.

An alternate source of radiation for the undulator to the quasi-optical gyrotron described above is a high power pulsed $CO_2$ laser because gigawatt power levels are readily available from such a source. However, a problem with using such high power levels is the difficulty in designing beam-line optical elements that can operate at high powers.

Briefly comparing the x-ray source of the invention with conventional devices (e.g., devices with a conventional bending-magnet source such as a storage ring), the projected wafer production rate of the device of the invention is, using a sensitive resist, about wafers per hour, which compares favorably with plasma and storage ring throughputs, at system cost that is much less that the synchrotron accelerator method of producing wafers. Further, high power (gigawatt) quasi-optical gyrotrons are efficient and reliable, and by appropriately adjusting either the microwave wavelength in the quasi-optical maser (resonator) or the electron beam energy, the x-ray radiation can be tuned to any desired wavelength and thus the emitted x-ray radiation can be predominantly at the wavelength desired for resist exposure.

Although the present invention has been described relative to specific exemplary embodiments thereof, it will be understood by those skilled in the art that other variations and modifications can be effected in these exemplary embodiments without departing from the scope and spirit of the invention. As an example, the foregoing embodiments employ an electron beam created by a storage ring. One could as readily use other known gyrotrons, such as the quasi-optical gyrotron.

Accordingly, the scope of the invention is discerned by reference to the appended claims, wherein:

What is claimed is:

1. An apparatus for producing x-rays, comprising:
   a resonant cavity comprising a pair of reflectors opposed to one another;
   means for pumping said cavity to establish an undulator field in said cavity between said reflectors;
   means for injecting a relativistic electron beam into said cavity substantially along the distance between said reflectors effective to cause said beam and said undulator field to interact to cause radiation of x-rays generally along said distance between said reflectors;
   the apparatus recited further comprising means for preventing loss of electromagnetic power from said cavity;
   wherein one of said reflectors has an orifice adapted to permit electromagnetic power in said cavity to exit said cavity, said loss preventing means comprises a further reflector connected to said orifice for effectively plugging said cavity against electromagnetic power loss.

2. The apparatus recited in claim 1 wherein said further reflector comprises a Bragg reflector including a plurality of periodically spaced corrugations along the length thereof, the periodic spacing of said corrugations being such that microwave fields are effectively trapped and reflected, and such that x-ray beams are allowed to pass unhampered through said reflector.

3. An apparatus for producing x-rays, comprising:
   a resonant cavity comprising a pair of reflectors opposed to one another;
   means for pumping said cavity to establish an undulator field in said cavity between said reflectors;
   means for injecting a relativistic electron beam into said cavity substantially along the distance between said reflectors effective to cause said beam and said undulator field to interact to cause radiation of x-rays generally along said distance between said reflectors;
   the apparatus further comprising means for preventing loss of electromagnetic power from said cavity;
   wherein said loss preventing means comprises an orifice and a tube which is connected to said orifice and across which a jet of neutral gas is pumped.

4. An electromagnetic apparatus for producing x-Rays, comprising:
   an electromagnetic cavity;
   means for pumping said cavity effective to produce a resonant electromagnetic undulator field in said cavity, said field disposed in a preselected direction;
   means for producing an electron beam disposed substantially along said direction of said undulator field;
   wherein said cavity and said means for producing are adapted to cause said electrons in said beam to undergo undulation by said field effective to produce x-rays responsive to said undulation;
   wherein said apparatus comprises a quasi-optical gyrotron, said quasi-optical gyrotron comprising said electromagnetic cavity and said means for pumping.

5. An electromagnetic apparatus for producing x-Rays, comprising:
   an electromagnetic cavity;
   means for pumping said cavity effective to produce a resonant electromagnetic undulator field in said cavity, said field disposed in a preselected direction;
   means for producing an electron beam disposed substantially along said direction of said undulator field;
   wherein said cavity and said means for producing are adapted to cause said electrons in said beam to undergo undulation by said field effective to produce x-rays responsive to said undulation;
   wherein the wavelength of said field is less than or equal to about 1 mm, and the mean kinetic energy of said electrons in said beam is less than or equal to about 0.25 GeV.

6. An apparatus for producing x-rays, comprising:
   a resonant cavity comprising a pair of reflectors opposed to one another;
   means for pumping said cavity to establish an undulator field in said cavity between said reflectors;
   means for injecting a relativistic electron beam into said cavity substantially along the distance between said reflectors effective to cause said beam and said undulator field to interact to cause radiation of x-rays generally along said distance between said reflectors;
   wherein said cavity is the resonant cavity of a quasi-optical gyrotron.

7. An apparatus for producing x-rays, said apparatus comprising:

a quasi-optical gyrotron having a cavity formed by opposed electromagnetic reflectors:

means for pumping said cavity to produce a microwave field within said cavity;

means for injecting a relativistic electron beam into said cavity substantially along the axis between said opposed reflectors, said injecting being effective to cause said beam and said microwave field to interact effective to produce said x-rays.

8. The apparatus of claim 7, wherein said means for pumping is a gyrating electron beam effective to radiate pumping gyro-radiation to said cavity.

* * * * *